United States Patent
D'Andrade et al.

(10) Patent No.: US 7,800,295 B2
(45) Date of Patent: Sep. 21, 2010

(54) ORGANIC LIGHT EMITTING DEVICE HAVING A MICROCAVITY

(75) Inventors: Brian D'Andrade, Westampton, NJ (US); Mike Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 11/521,431

(22) Filed: Sep. 15, 2006

(65) Prior Publication Data

US 2008/0067921 A1    Mar. 20, 2008

(51) Int. Cl.
*H01L 51/50* (2006.01)
*H05B 33/14* (2006.01)
*H05B 33/00* (2006.01)

(52) U.S. Cl. .................. 313/504; 313/506; 313/507; 445/24; 257/103

(58) Field of Classification Search .......... 313/500–512
See application file for complete search history.

(56) References Cited

U.S. PATENT DOCUMENTS

| | | | |
|---|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,837,391 A * | 11/1998 | Utsugi ................... 428/690 |
| 5,844,363 A | 12/1998 | Gu et al. |
| 5,932,895 A | 8/1999 | Shen et al. |
| 5,949,187 A | 9/1999 | Xu et al. |
| 6,013,982 A | 1/2000 | Thompson et al. |
| 6,087,196 A | 7/2000 | Sturm et al. |
| 6,091,195 A | 7/2000 | Forrest et al. |
| 6,091,197 A * | 7/2000 | Sun et al. ................ 313/509 |
| 6,097,147 A | 8/2000 | Baldo et al. |
| 6,133,692 A | 10/2000 | Xu et al. |
| 6,232,714 B1 | 5/2001 | Shen et al. |
| 6,294,398 B1 | 9/2001 | Kim et al. |
| 6,303,238 B1 | 10/2001 | Thompson et al. |
| 6,310,360 B1 | 10/2001 | Forrest |
| 6,326,224 B1 | 12/2001 | Xu et al. |
| 6,337,102 B1 | 1/2002 | Forrest et al. |
| 6,337,492 B1 | 1/2002 | Jones et al. |
| 6,468,819 B1 | 10/2002 | Kim et al. |
| 6,548,956 B2 | 4/2003 | Forrest et al. |

(Continued)

FOREIGN PATENT DOCUMENTS

EP    1154676    11/2001

(Continued)

OTHER PUBLICATIONS

Changhee Lee, OLED 1-Introduction, Jan. 1, 2005, Seoul University, slides 15-20.*

(Continued)

*Primary Examiner*—Sikha Roy
*Assistant Examiner*—Tracie Green
(74) *Attorney, Agent, or Firm*—Kenyon & Kenyon LLP

(57) ABSTRACT

The present invention provides OLEDs incorporating microcavities. By combining a microcavity with a non-microcavity emissive layer, improved saturation and luminance may be achieved. OLEDs incorporating microcavities according to the invention may be used to produce white light, and as sub-pixels in full-color displays.

28 Claims, 7 Drawing Sheets

U.S. PATENT DOCUMENTS

| | | | |
|---|---|---|---|
| 6,576,134 | B1 | 6/2003 | Agner |
| 6,602,540 | B2 | 8/2003 | Gu et al. |
| 6,885,149 | B2 | 4/2005 | Parthasarathy et al. |
| 7,023,013 | B2 | 4/2006 | Ricks et al. |
| 7,142,179 | B2 * | 11/2006 | Miller et al. ............... 345/76 |
| 7,274,045 | B2 * | 9/2007 | Chandran et al. ........... 257/100 |
| 2002/0034656 | A1 | 3/2002 | Thompson et al. |
| 2002/0182441 | A1 | 12/2002 | Lamansky et al. |
| 2003/0072964 | A1 | 4/2003 | Kwong et al. |
| 2003/0230980 | A1 | 12/2003 | Forrest et al. |
| 2005/0073228 | A1 | 4/2005 | Tyan et al. |
| 2005/0142976 | A1 * | 6/2005 | Suzuki ..................... 445/24 |
| 2005/0236981 | A1 * | 10/2005 | Cok et al. ................. 313/504 |
| 2005/0280362 | A1 * | 12/2005 | Shore et al. ............... 313/506 |
| 2005/0282036 | A1 * | 12/2005 | D'Andrade et al. ......... 428/690 |
| 2005/0285508 | A1 * | 12/2005 | Murayama et al. ......... 313/503 |
| 2006/0006792 | A1 | 1/2006 | Strip |
| 2006/0214596 | A1 * | 9/2006 | Miller et al. ............ 315/169.3 |
| 2007/0031097 | A1 * | 2/2007 | Heikenfeld et al. ......... 385/129 |

FOREIGN PATENT DOCUMENTS

| | | |
|---|---|---|
| EP | 1450419 | 8/2004 |
| WO | WO 98/34214 | 8/1998 |
| WO | 02/074015 | 9/2002 |
| WO | WO 2006/075822 | 7/2006 |

OTHER PUBLICATIONS

U.S. Appl. No. 10/233,470, filed Sep. 4, 2002, Forrest et al.

Adachi et al., "Nearly 100% internal phosphorescence efficiency in an organic light emitting device", J. App. Phys. vol. 90 No. 10, 5048-51, Nov. 15, 2001.

Baldo et al., "Highly Efficient Phosphorescent Emission from Organic Electroluminescent Devices", Nature 395:151-154, 1998.

Baldo et al., "Very high efficiency green organic light-emitting devices based on electrophosphorescence," Appl. Phys.Lett. 75(3):4-6, 1999.

Chan et al., Cavity Design and optimization for organic microcavity OLEDS, Proc. Of SPIE, vol. 6038, pp. 603824-1-603824-9.

Cho et al., "Microcavity two-unit tandem organic light emitting devices having a high efficiency", Appl. Phys. Letters, 88:1111061-3, 2006.

Djurisic et al., "Organic microcavity light-emitting diodes with metal mirros: dependence of the emission wavelength on the viewing angle", Appl. Optics 41(36)7650-7656, 2002.

Dodabalapur et al., "Microcavity effects in organic semiconductors", Appl. Phys. Lett 64(19):2486-2488, 1994.

Dodabalapur et al., "Physics and applications of organic microcavity light emitting diodes", J. Appl. Phys. 80(12):6954-6964, 1996.

Han et al., "Color tunable metal-cavity organic light emitting diodes with fullerene layer", J. of Appl Phys 97:093102-1-093102-5,2005.

Jordan et al., "Efficiency enhancement of microcavity organic light emitting devices", Appl Phys Lett 69(14):1997-1999, 1996.

Liu et al., "Microcavity organic light emitting diodes with double sided light emission of different colors", J. Vac. Sci. Technol. 22(3):764-767.

Rothberg et al., "Resonant cavity organic electroluminescent devices", IEDM 94-571-94-573, 1994.

Shiga et al., "Design of multiwavelength resonant cavities for white organic light-emitting diodes", J. Appl. Phys. 93(1):19-22, 2003.

Tokito et al., "Microcavity organic light-emitting diodes for strongly directed pure red, green and blue emissions", J. Appl. Phys. 86(5):2407-2411.

PCT International Search Report and Written Opinion for PCT/US2007/017835 mailed on Mar. 11, 2008.

* cited by examiner

ORGANIC LIGHT EMITTING DEVICE HAVING A MICROCAVITY

This application is related to co-pending U.S. Application No. 60/884,636, filed Sep. 15, 2006, which is a continuation-in-part of U.S. application Ser. No. 11/241,981, filed Oct. 4, 2005, the disclosures of which are incorporated by reference in their entireties.

RESEARCH AGREEMENT

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to OLEDs having a microcavity structure.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

The light emitted by OLEDs may be characterized using known standards. For example, CIE ("Commission Internationale d'Eclairage") is a recognized two-coordinate measure of the color of light. Ideal white light has a CIE of (0.33, 0.33). For white light sources, CRI ("Color Rendering Index") is a recognized measure of the color shift that an object undergoes when illuminated by the light source as compared with the color of the same object when illuminated by a reference source comparable to daylight. CRI values range from 0 to 100, with 100 representing no color shift. Bright sunlight may have a CRI of 100. Fluorescent light bulbs have a CRI of 60-99, mercury lamps near 50, and high-pressure sodium lamps can have a CRI of about 20. Lamps used for home or office lighting, for example, generally must meet very strict CIE and CRI requirements, whereas lamps used for street lighting, for example, may be subject to more lenient CIE and CRI requirements.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (EP) are measured as a negative energy relative to a vacuum level, a higher HOMO energy level corresponds to an EP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

The present invention provides OLEDs incorporating microcavities. By combining a microcavity with a non-microcavity emissive layer, improved saturation and luminance may be achieved. OLEDs incorporating microcavities according to the invention may be used to produce white light, and as sub-pixels in full-color displays.

A stacked OLED may comprise a standard OLED and a microcavity. The microcavity may be tuned, such as by adjusting the reflectivity and separation of the reflective layers defining the microcavity. The microcavity may be tuned to produce an emission spectrum having a peak that complements the emission spectrum of the standard OLED, such as to produce white light. That is, the relatively broad-spectrum emission of a standard OLED may be combined with the relatively narrow emission of a microcavity to achieve saturated emission. Additionally, white light emission may be achieve by using only two emissive layers.

DETAILED DESCRIPTION

Figure 1:
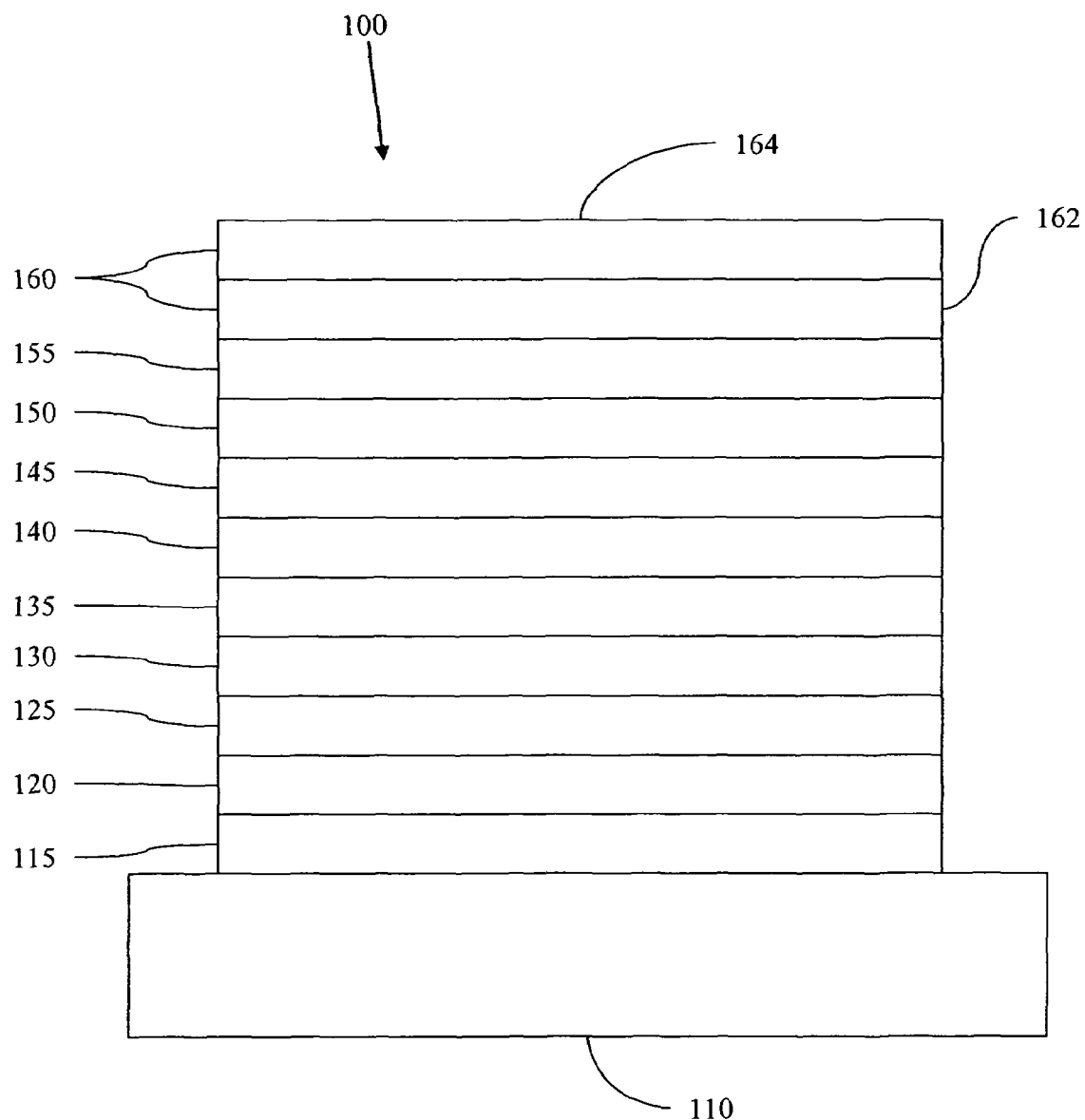
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003-0230980 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-0230980 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an EP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
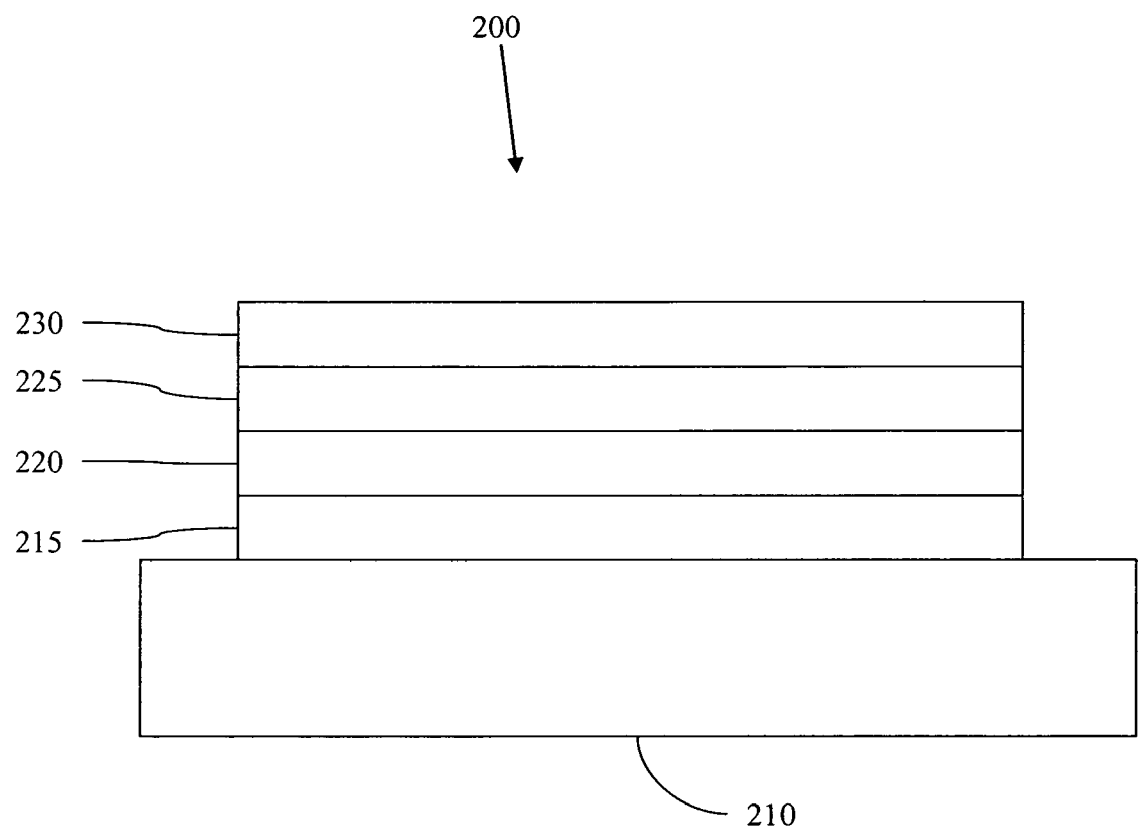
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

OLEDs may be constructed such that electrodes or other reflective or semi-reflective layers of the device define a microcavity. A microcavity may be formed when the optical distance between two reflective or semi-reflective layers has a magnitude that is comparable to the wavelength of visible light. The transmission of the microcavity may then exceed the transmission of the individual reflective or semi-reflective layers at a resonant wavelength of the microcavity. As used herein the two layers may be referred to as "defining" a microcavity when the layers meet these criteria.

The resonant peaks in the transmission spectrum of a microcavity may be controlled by adjusting the reflectivity of the layers defining the microcavity and the separation between the layers. In general, microcavities may be constructed that have one transparent or semitransparent reflective layer and one opaque reflective layer. The emission in the forward direction (i.e., through the transparent or semitransparent reflective layer) may be calculated as:

$$|E_c(\lambda)|^2 = \frac{(1-R_d)\left[1+R_m+2\sqrt{R_m}\cos\left(\frac{4\pi x}{\lambda}\right)\right]}{1+\sqrt{R_m R_d}\cos\left(\frac{4\pi L}{\lambda}\right)}|E_n(\lambda)|^2 \quad \text{(Eq. 1)}$$

where λ is the emission wavelength, x is the effective distance of the emissive layer from the opaque layer, $R_m$ and $R_d$ are the reflectivities of the opaque mirror and the transparent mirror, respectively, L is the total optical length of the microcavity, and $E_n(\lambda)$ is an original (free-space) spectrum. The optical length of the microcavity, L, may be given by:

$$L = \frac{\lambda}{2}\left(\frac{n_{\text{eff}}}{\Delta n}\right) + \sum_i n_i d_i + \left|\frac{\varphi_m}{4\pi}\lambda\right| \quad \text{(Eq. 2)}$$

where $n_{\text{eff}}$ and Δn are the effective refractive index and the index difference between the reflective layers, $n_i$ and $d_i$ are the refractive index and the thickness of the organic layers and the transparent layer, and $\phi_m$ is the phase change at the opaque mirror.

A microcavity may be characterized by its resonant wavelength. A microcavity generally emits saturated light in one or more relatively narrow regions of the visible spectrum, and may emit less or no light in other regions. The wavelengths corresponding to a peak or peaks in the emission spectrum may be referred to as the resonant wavelength or wavelengths of the microcavity.

A microcavity also may be characterized by its finesse. The finesse F of a microcavity is defined as the ratio of the separation between resonant peaks in the transmission spectrum of the microcavity, Δυ, to the full-width at half-maximum of the resonant frequency peak of the spectrum, $\Delta\upsilon_{1/2}$: F=Δυ/$\Delta\upsilon_{1/2}$. In general, a microcavity will have a finesse greater than about 1.5. It may be preferred for microcavities used in conjunction with the present invention to have a finesse of at least about 5, which corresponds to a spectrum having, for example, a FWHM of 60 nm and resonant peak separation of 300 nm.

In some cases, "standard" OLEDs have been described as having "microcavity effects." These effects are usually undesirable. For example, a device may quench, prevent, or otherwise diminish emission at some wavelengths, and/or increase emission at certain wavelengths at which the device emits. While these and similar effects may be referred to as "microcavity effects," these devices are not considered to contain or define a "microcavity." As used herein, a "standard" OLED is one which does not have layers defining a microcavity; two layers, such as two electrodes disposed on either side of an organic layer, may be said to define a standard OLED when the reflectivities and spacing of the layers does not result in the formation of a microcavity. A standard OLED generally has a finesse of less than about 1.5. Such a device may, however, exhibit "microcavity effects" as discussed above. The organic layer disposed between the layers that define a standard OLED may comprise multiple layers or sublayers.

According to the invention, the transmission, reflectance, and separation of two layers which define a microcavity may be adjusted to create a microcavity that has desired emission characteristics. For example, the "narrowness" of the emission of a microcavity (i.e., the full width at half-maximum of a peak in the emission spectrum) may be adjusted by adjusting the reflectance of the layers defining the microcavity. The transmission and reflectance of the layers defining the microcavity may be adjusted, for example, by adjusting the thickness of the layers or the amount of reflective material in the layers.

Figure 3:
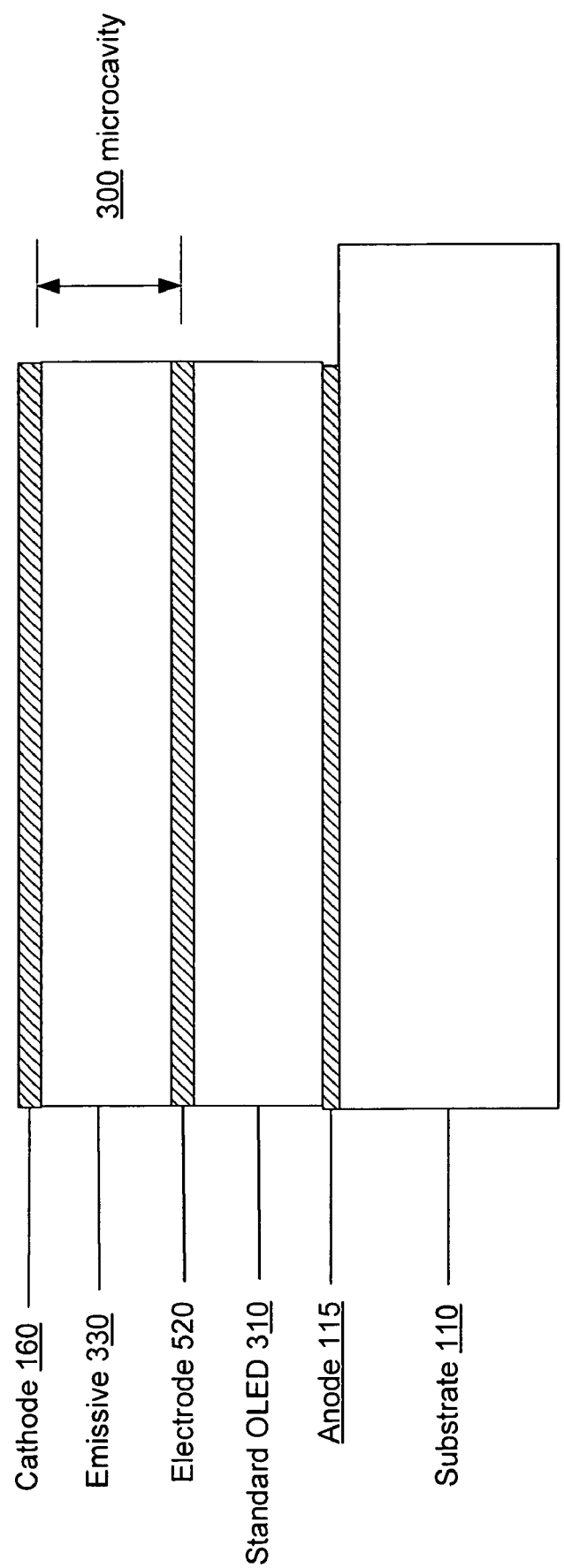
FIG. 3 shows an OLED including a microcavity.

FIG. 3 shows a device having a microcavity according to the invention. An anode 115 is deposited on a substrate 110 as previously described. One or more organic layers 310, 330 are disposed between the anode 115 and a cathode 160. The organic layers are disposed in two regions on either side of an internal electrode 320, with each region having at least one emissive layer or comprising an emissive material. The organic layers 310, 330 may also comprise various layers and sublayers, such as blocking layers and/or transport layers, as previously described. In some cases, one or more "spacers" may be used, where a "spacer" is a layer that does not substantially affect the emission characteristics or operation of the device. Spacers generally are used to adjust the separation of the electrodes defining the microcavity.

In the device shown in FIG. 3, the cathode 160 and the electrode 320 are arranged to define a microcavity 300. Preferred materials for the cathode and/or the electrode may include silver, aluminum, and compounds of silver and/or aluminum. Preferred materials for the organic layers may be selected for a desired emission spectrum based on emission characteristics known in the art. The resonant wavelength of the microcavity, and hence the location of peaks in the spectrum of light emitted by the microcavity, may be adjusted by changing the reflectivity and relative positions of the cathode 160 and the electrode 320.

A device according to the invention, such as that illustrated in FIG. 3, may be used to produce white light. The microcavity 300 may be tuned to produce a first spectrum of light. A standard OLED having a second emission spectrum may be combined with the microcavity, allowing for emission by the device of light having a spectrum that is the combination of the microcavity spectrum and the standard OLED spectrum. For example, the microcavity 300 may be tuned to produce blue light. A standard OLED defined by the electrode 320 and the anode 115 may include an emissive layer that emits orange light. When the device is operated, white light may be produced.

Devices according to the present invention may be used to produce white light, such as for general illumination, backlighting of electronic devices, or other similar applications. Such light may be accomplished using two emissive layers, by incorporating emissive layers that emit at complementary wavelengths. Devices using microcavities may exhibit off-angle effects. Generally the emission of a microcavity in the forward direction (i.e., along a line perpendicular to the emission surface of the microcavity) is saturated emission at the resonant wavelength of the microcavity. When viewed from other angles, the color of the emitted light may appear shifted away from the resonant wavelength, due to the optical effects and characteristics inherent to a microcavity. In devices according to the invention, a diffuser or other layer or device may be used to compensate for such effects. In applications where the devices will be used, for example, as a backlight or general illumination source, the white light produced by the device may be passed through a diffuser or filter to reduce any off-angle effects produced by the use of a microcavity.

Figure 4:
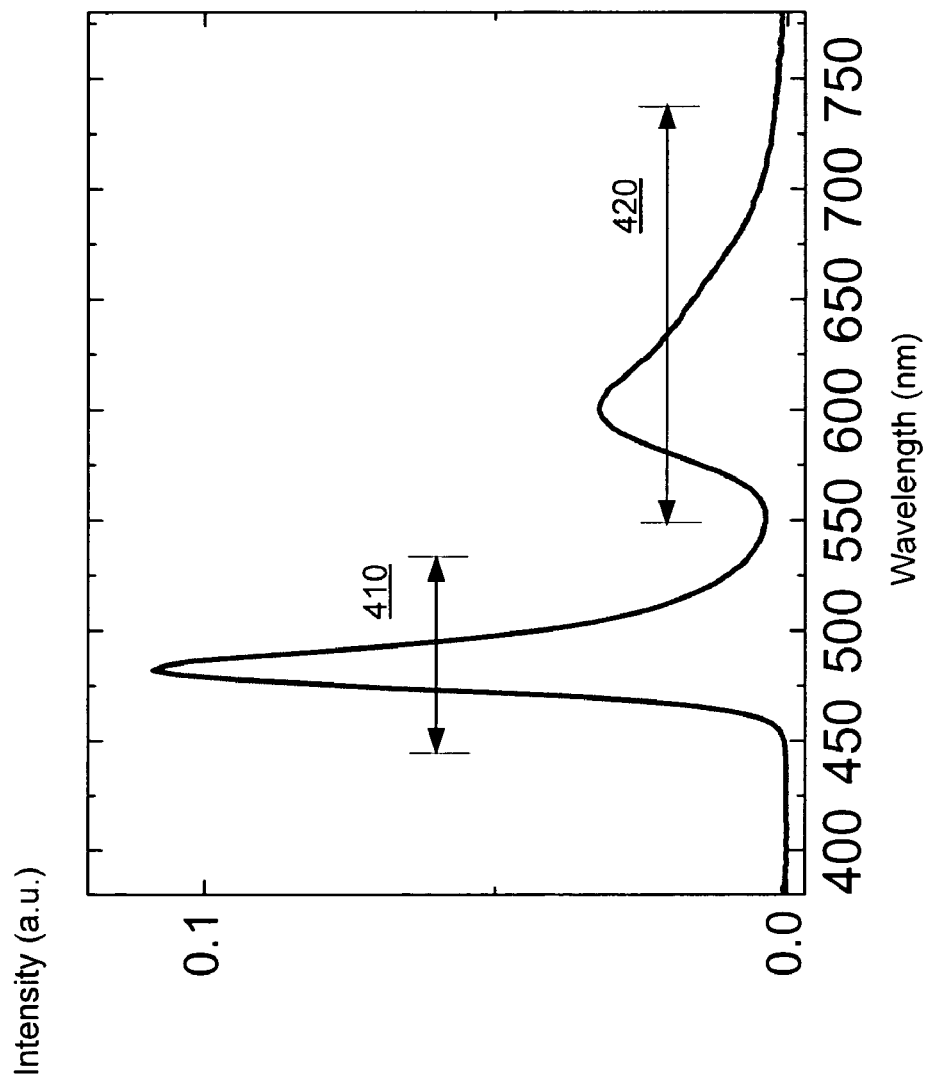
FIG. 4 shows the emission spectrum of a device having a microcavity.

FIG. 4 shows an exemplary spectrum of such a device. The microcavity emission 410 may have a CIE with an x-coordinate less than about 0.30 and a y-coordinate of less than about 0.40 (blue), while the standard OLED emission 420 may be orange. The device may therefore emit generally white light. It is preferred that the emitted light have a CIE of about (0.33±0.05, 0.33±0.05), and more preferably of about (0.33±0.01, 0.33±0.01). A specific CIE may be achieved by tuning the microcavity to produce a spectrum that is complementary to the spectrum produced by the standard OLED.

A white-emitting device such as that described with reference to FIG. 3 may be advantageous because operationally stable emitters can be used in the microcavity. Presently, many materials used to produce higher-energy (i.e., more blue, shorter wavelength) spectra may have poor operations stability. Combining such a material with a lower-energy (i.e., more red, longer wavelength) emitter may therefore result in a device having poor operational stability. Using an operationally stable emitter in a microcavity may therefore provide an alternative that meets display specifications for lifetime, color, and efficiency. To allow a range of materials to be used in a complementary standard OLED, higher-energy emission from the microcavity may be desired. Therefore it may be preferred to tune a microcavity according to the invention to emit light having a CIE with an x-coordinate of less than about 0.30, and more preferably less than about 0.20, and a y-coordinate of less than about 0.40, more preferably less than about 0.30.

The "stability" of an OLED or a layer of emissive material in an OLED may be measured in a number of ways. One stability measurement is the operational stability of the electroluminescent device which can be measured in terms of operational half-life. The operational half-life is the time required for the luminance of the device to decay from the initial luminance (L0) to 50% of its initial luminance (L0.5) under constant current and at room temperature unless otherwise noted. Operational half-life depends upon luminance at which the device is operated, because a higher luminance generally corresponds to a faster decay in a particular device. Luminance may be measured in cd/m2. Devices in accordance with embodiments of the present invention can advantageously have an operational half-life in excess of about 3,000 hours, preferably about 25,000 hours, and more preferably about 40,000 hours at initial luminance of about 100 $cd/m^2$, preferably about 500 $cd/m^2$, more preferably about 1500 $cd/m^2$.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:
As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthro line
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)-4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
PQIr: iridium(III) bis(2-phenyl quinolyl-N,C2')
Compound K: fac-tris[2-(N-(2,6-diphenyl-4-isopropylphenyl)imidazol-2-yl-kN)-5-fluorophenyl-kC]iridium(III)
Compound A: fac-tris[N-(2,4,6-triphenylphenyl)-2-phenylimidazole]

Experimental:
Specific representative embodiments of the invention will now be described, including how such embodiments may be made. It is understood that the specific methods, materials, conditions, process parameters, apparatus and the like do not necessarily limit the scope of the invention. Devices were fabricated with a variety of emissive materials, and the emission spectra and lifetimes were measured. Combined spectra for complementary emissive materials were measured or simulated to determine the resulting spectra and lifetimes.

Figure 5:
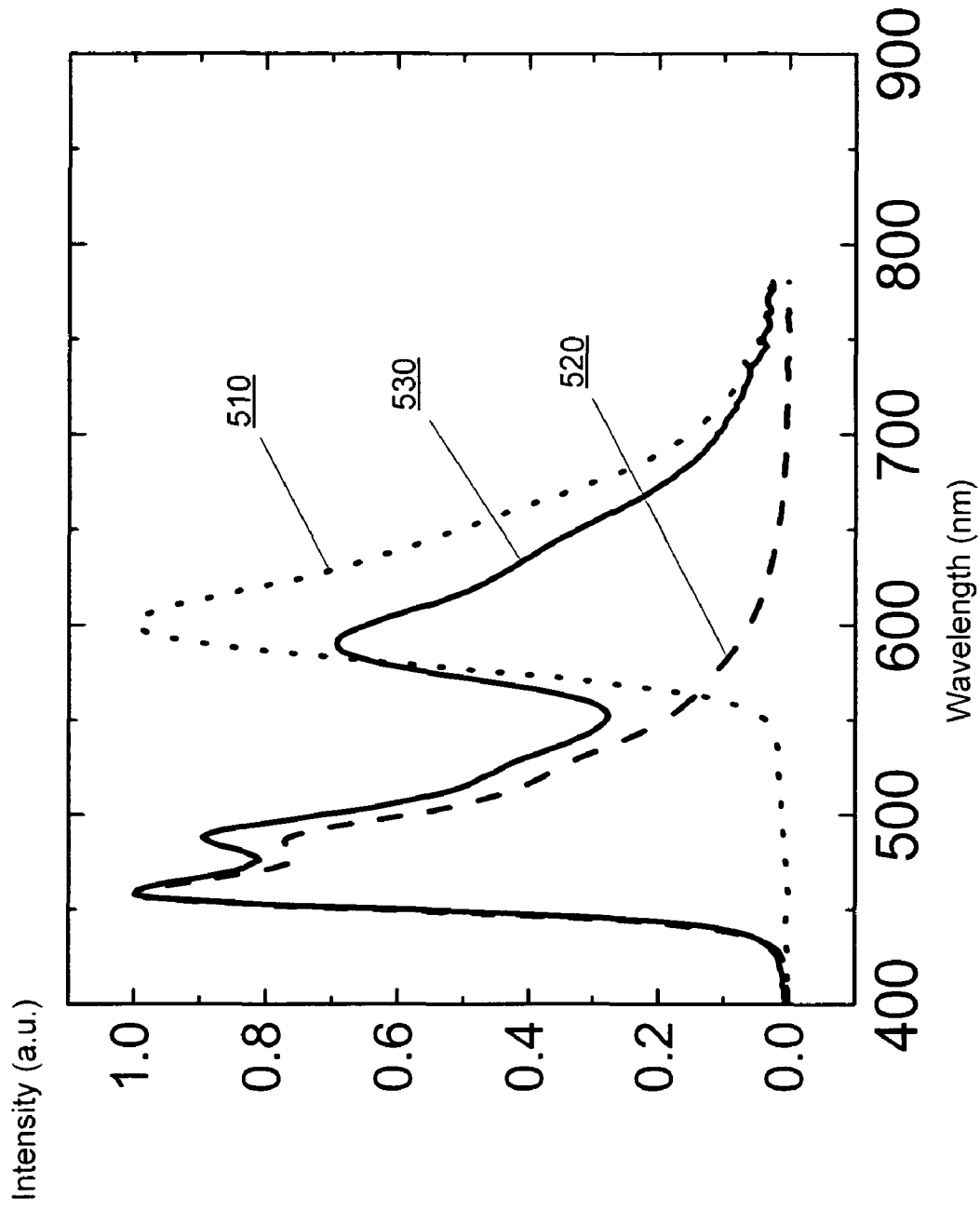
FIG. 5 shows emission spectra for a device having various emissive layers.

Compound K is an emissive material that produces light having a CIE of about (0.17, 0.25). PQIr produces light having a CIE of about (0.61, 0.38). Further details regarding PQIr are given in U.S. Pat. No. 6,835,469 to Kwong et al., the disclosure of which is incorporated by reference in its entirety. Further details regarding Compound K are given in U.S. application Ser. No. 11/241,981, the disclosure of which is incorporated by reference in its entirety. A device using layers of Compound K and PQIr may be fabricated to produce white light. FIG. 5 shows measured emission spectra for devices having a PQIr emissive layer (510), a Compound K emissive layer (520), and both a PQIr emissive layer and a Compound K emissive layer (530). As shown in FIG. 5, Compound K and PQIr may be used in a device to produce white light with a CIE of about (0.33, 0.33). However, Compound K has an operational half-life of about 3,000 hours at 500 $cd/m^2$, while PQIr has an operational half-life of about 40,000 hours at 500 $cd/m^2$. Thus, while the combination may provide the desired light, it may result in a relatively short-lived device due to the relatively low stability of Compound K.

Figure 6B:
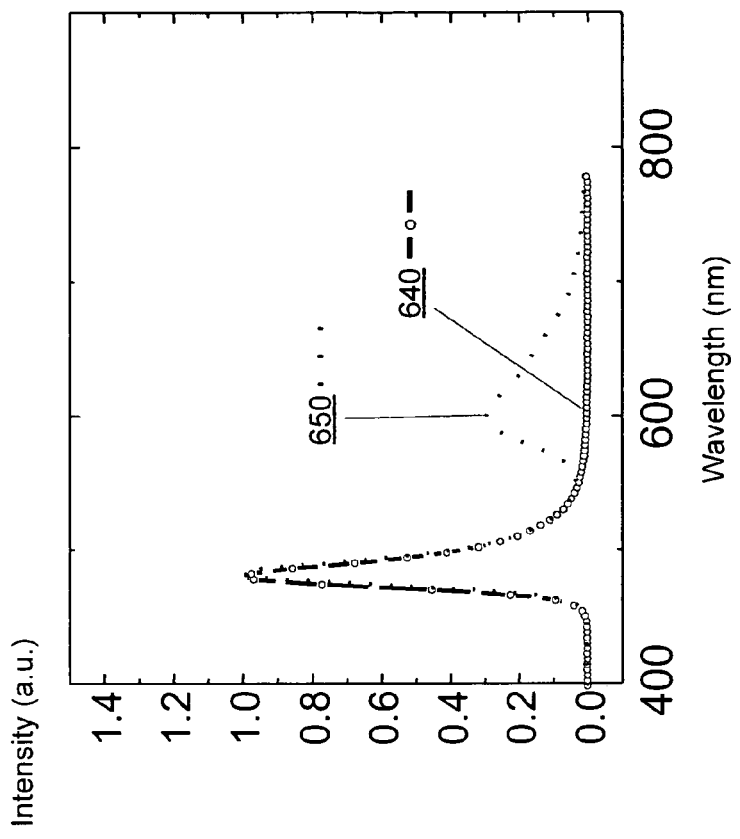
FIG. 6 shows emission spectra for a device having various emissive layers.
Figure 6A:
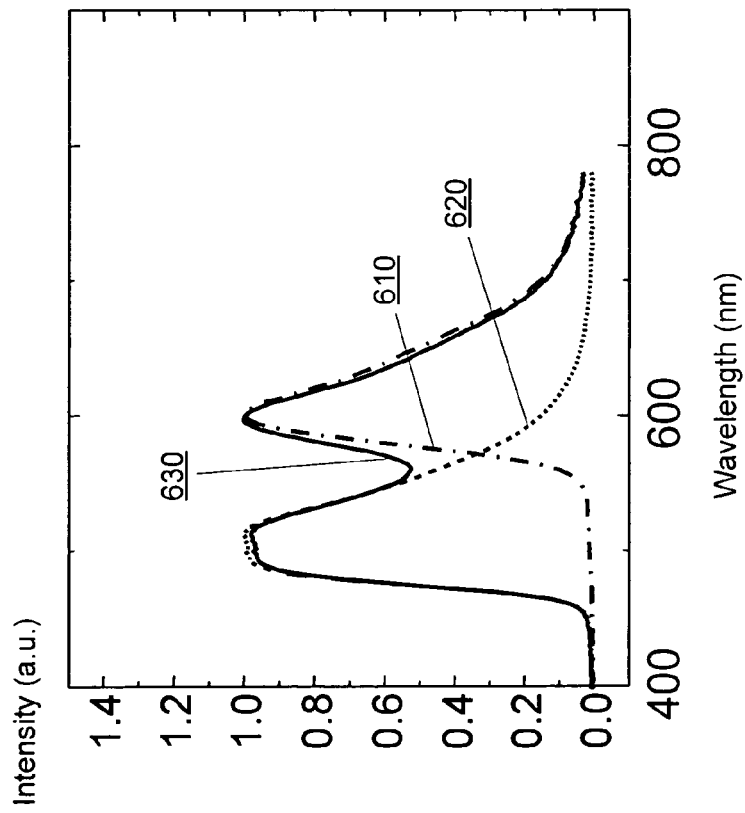

To produce a white-emitting device with a longer operational half-life, a more stable emitter may be used. Compound A is a blue-green phosphorescent emitter with CIE (0.24, 0.54), and an operational half-life of 25,000 hours at 500 cd/m$^2$. There is no linear combination of Compound A and PQIr that can result in emitted light with a CIE of (0.33, 0.33). However, Compound A may be used in a device having a microcavity tuned to emit light with a CIE of (0.10, 0.26); when combined with the emission of PQIr a CIE (0.33, 0.33) (white) light is produced. The various emission spectra of PQIr and Compound A are shown in FIG. 6. FIG. 6A shows the measured emission spectra of PQIr (610), Compound A (620), and a device having a PQIr emissive layer and a Compound A emissive layer (630). FIG. 6B shows the measured emission spectrum of Compound A in a microcavity (640) and the calculated spectrum of a stacked device having a microcavity with an emissive layer comprising Compound A, and a layer comprising PQIr (650). The stacked device emission spectrum was calculated from linear combinations of the measured spectra.

Figure 7:
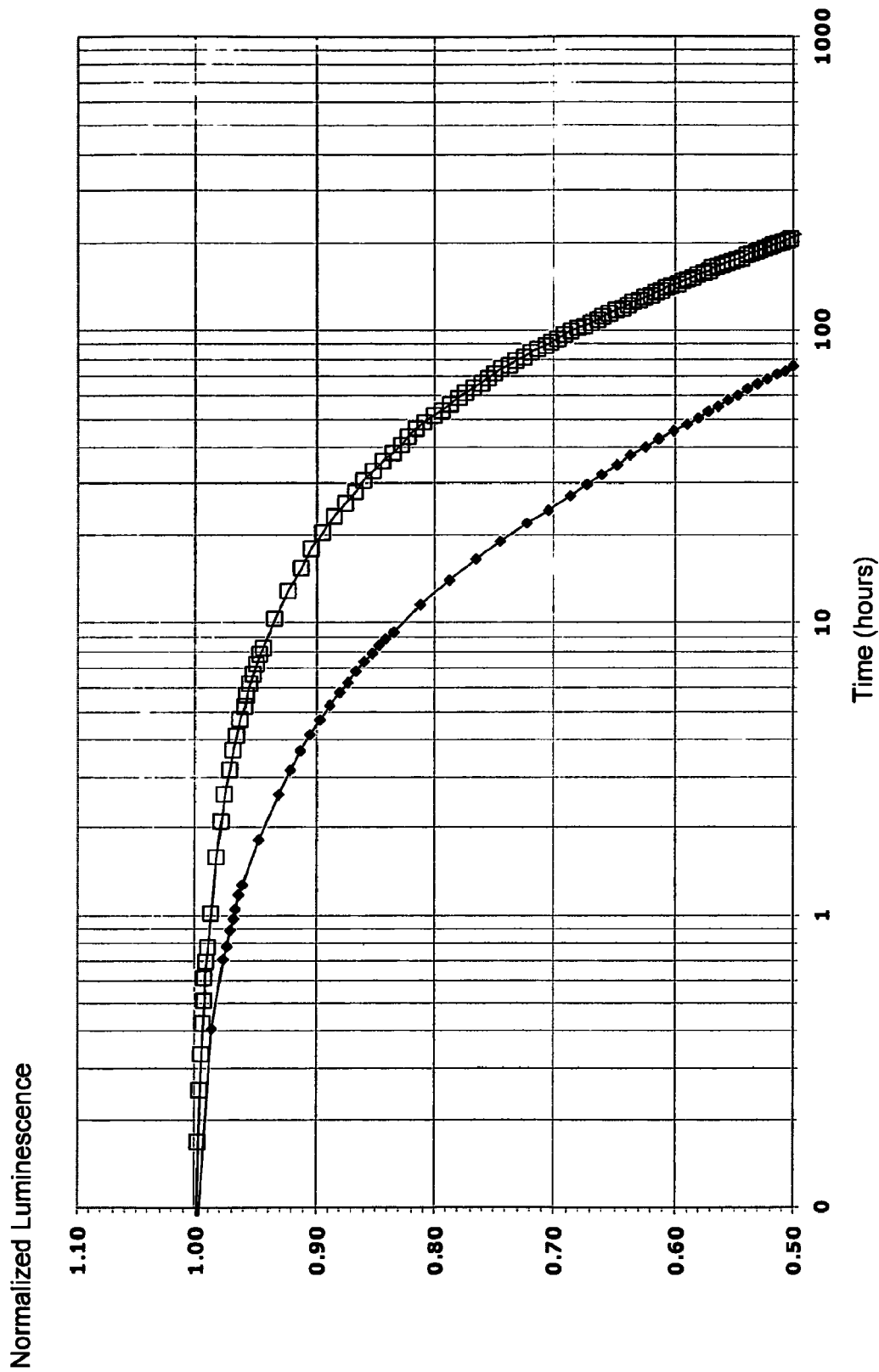
FIG. 7 shows exemplary stability data for two emissive layers.

As illustrated by the devices, materials and emission spectra described with respect to FIGS. 5-6, a device may be constructed using a first emissive material having a relatively high operational stability, and a second emissive material having a comparably high operational stability but less favorable CIE. The second material may be used in a microcavity to produce white light by shifting the CIE coordinates of the second emissive material. FIG. 7 shows exemplary stabilities for devices using Compound A and Compound K. The normalized luminescence as a function of time is shown for Compound A (open squares) at J=40 mA/cm$^2$ (L0=7400 nits) and for Compound K (diamonds) at J=40 mA/cm2 (L0=3670 nits). The devices used to measure the stabilities had the following structures:

Compound A:

CuPc (10 nm)/NPD (30 nm)/mCBP:Compound A 9% (30 nm)/Alq (40 nm)/LiF/Al

Compound K:

CuPc (10 nm)/NPD (30 nm)/mCBP:Compound K 9% (30 nm)/Alq (40 nm)/LiF/Al

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device comprising:
   a first electrode;
   a second electrode;
   a third electrode;
   a first organic emissive layer disposed between the first electrode and the second electrode; and
   a second organic emissive layer disposed between the second electrode and the third electrode;
   wherein:
      the first electrode and the second electrode define a microcavity, said microcavity shifting the CIE coordinates of the emission of the first organic emissive layer such that the device emits light having a CIE of (0.33±0.05, 0.33±0.05);
      there are no electrodes between the first electrode and the second electrode;
      the second electrode and the third electrode define a standard OLED;
      the first organic emissive layer comprising a single first emissive material that emits in a first wavelength region, and the second organic emissive layer comprising a single second emissive material that emits in a second wavelength region, the first wavelength region being shorter than the second wavelength region; and
      the combination of the unshifted emission spectrum of the first emissive layer and the emission spectrum of the second emissive layers does not result in emitted light having a CIE of (0.33±0.05, 0.33±0.05).

2. The device of claim 1 wherein the device has an operational half-life of at least 25,000 hours at 500 cd/m$^2$.

3. The device of claim 1 wherein the device has an operational half-life of at least 40,000 hours at 500 cd/m$^2$.

4. The device of claim 1 wherein the device has an operational half-life of at least 25,000 hours at 1500 cd/m$^2$.

5. The device of claim 1 wherein the device emits light having a CIE of (0.33±0.01, 0.33±0.01).

6. The device of claim 1 wherein the microcavity defined by the first electrode and the second electrode has a finesse of at least 5.

7. The device of claim 1 wherein the microcavity is configured to emit light having a CIE with an x-coordinate less than 0.30 and a y-coordinate of less than 0.40.

8. The device of claim 1 wherein the microcavity is configured to emit light having a CIE with an x-coordinate less than 0.20 and a y-coordinate of less than 0.30.

9. The device of claim 1 wherein the microcavity has an emission spectrum with a single peak in the visible spectrum.

10. The device of claim 2, wherein at least one of the first organic emissive layer and the second organic emissive layer is an organic small molecule layer.

11. The device of claim 3, wherein at least one of the first organic emissive layer and the second organic emissive layer is an organic small molecule layer.

12. The device of claim 4, wherein at least one of the first organic emissive layer and the second organic emissive layer is an organic small molecule layer.

13. The device of claim 5, wherein at least one of the first organic emissive layer and the second organic emissive layer is an organic small molecule layer.

14. The device of claim 1, wherein the second organic emissive layer has an emission spectrum with a single peak in the visible spectrum.

15. A device comprising:
   an emissive layer comprising:
      a single microcavity defined by a first electrode and a second electrode; and
      a first organic emissive layer disposed within the single microcavity, said microcavity shifting the CIE coordinates of the emission of the first organic emissive layer such that the device emits light having a CIE of (0.33±0.05, 0.33±0.05);
   a third electrode disposed adjacent to the second electrode; and
   a second organic emissive layer disposed between the second electrode and the third electrode;
   wherein:
      there are no electrodes between the first electrode and the second electrode;
      the second electrode and the third electrode define a standard OLED;

the first organic emissive layer comprising a single first emissive material that emits in a first wavelength region, and the second organic emissive layer comprising a single second emissive material that emits in a second wavelength region, the first wavelength region being shorter than the second wavelength region; and the combination of the unshifted emission spectrum of the first emissive layer and the emission spectrum of the second emissive layer does not result in emitted light having a CIE of (0.33±0.05, 0.33±0.05).

16. The device of claim 14 wherein the device has an operational half-life of at least 25,000 hours at 500 cd/m$^2$.

17. The device of claim 15 wherein at least one of the first organic emissive layer and the second organic emissive layer is an organic small molecule layer.

18. The device of claim 14 wherein the device has an operational half-life of at least 40,000 hours at 500 cd/m$^2$.

19. The device of claim 18 wherein at least one of the first organic emissive layer and the second organic emissive layer is an organic small molecule layer.

20. The device of claim 14 wherein the device has an operational half-life of at least 25,000 hours at 1500 cd/m$^2$.

21. The device of claim 20 wherein at least one of the first organic emissive layer and the second organic emissive layer is an organic small molecule layer.

22. The device of claim 14 wherein the device emits light having a CIE of (0.33±0.01, 0.33±0.01).

23. The device of claim 22 wherein at least one of the first organic emissive layer and the second organic emissive layer is an organic small molecule layer.

24. The device of claim 15 wherein the second organic emissive layer has an emission spectrum with a single peak in the visible spectrum.

25. The device of claim 1, wherein said first organic emissive layer emits light having a CIE with an x-coordinate less than 0.30 and a y-coordinate less than about 0.40.

26. The device of claim 25, wherein said second organic emissive layer emits orange light.

27. The device of claim 15, wherein said first organic emissive layer emits light having a CIE with an x-coordinate less than 0.30 and a y-coordinate less than about 0.40.

28. The device of claim 27, wherein said second organic emissive layer emits orange light.

* * * * *